United States Patent [19]

Iwasawa et al.

[11] 3,946,427

[45] Mar. 23, 1976

[54] SEMICONDUCTOR DEVICE

[75] Inventors: Hideo Iwasawa, Kodaira; Yoshiaki Wakashima, Kawasaki; Hideo Inayoshi, Tokyo, all of Japan

[73] Assignee: Hitachi, Ltd., Japan

[22] Filed: Oct. 15, 1974

[21] Appl. No.: 514,956

[30] Foreign Application Priority Data
Oct. 12, 1973    Japan.............................. 48-113928

[52] U.S. Cl.................. 357/72; 174/52 PE; 357/52; 357/54; 427/93; 427/387
[51] Int. Cl.²......................................... H01L 23/30
[58] Field of Search............ 260/46.5 R; 357/72, 52, 357/54; 174/52 PE; 427/93, 387

[56] References Cited
UNITED STATES PATENTS

| | | | |
|---|---|---|---|
| 2,258,222 | 10/1941 | Rochow | 260/46.5 R |
| 3,047,780 | 7/1962 | Metz | 357/72 |
| 3,206,647 | 9/1965 | Kahn | 357/72 |
| 3,411,122 | 11/1968 | Schiller et al. | 357/72 |
| 3,414,433 | 12/1968 | Bramer | 357/72 |
| 3,447,975 | 6/1969 | Bilo et al. | 357/72 |
| 3,496,427 | 2/1970 | Lee | 357/72 |
| 3,792,012 | 2/1974 | Zdaniewski | 260/46.5 R |
| 3,839,280 | 10/1974 | Zdaniewski | 260/46.5 R |

*Primary Examiner*—William D. Larkins
*Attorney, Agent, or Firm*—Craig & Antonelli

[57]     ABSTRACT

In a semiconductor device, the surface of a semiconductor element is covered with a silicone varnish in which the side chain radical ratio between methyl radicals and phenyl radicals is 20:1 or greater, whereby the element is effectively shielded from the external moisture.

8 Claims, 1 Drawing Figure

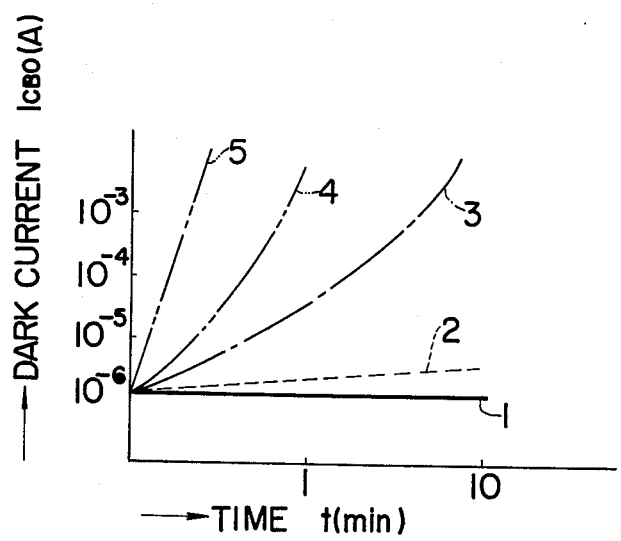

SEMICONDUCTOR DEVICE

BACKGROUND OF THE INVENTION

1. Field of the Invention

The present invention relates to semiconductor devices, and more particularly to a semiconductor device in which secular deterioration of the electrical characteristics of semiconductor elements is prevented by a coating of silicone varnish.

2. Description of the Prior Art

In semiconductor devices, a variety of shielding means are generally provided in order to shield the surface of an element, especially the end of a P-N junction and the portion of an aluminum electrode, from external moisture etc. and to thus prevent the characteristics of the element from being deteriorated.

As the shielding means, there have hitherto been known resin sealing means and hermetic sealing means such as can sealing and ceramic sealing. The latter method, such as can sealing and ceramic sealing, is considerably expensive. In order to obtain products of low cost, the resin sealing means which is comparatively inexpensive is adopted.

In a practical example of a method of using the resin sealing means, an element after completion of the assembling steps of pellet mounting, wire bonding etc. is wrapped in an epoxy resin such as P 410B (Trade name of Morton Chemical Company), and the resin is solidified by thermal hardening at for example 150° to 180°C. According to Japanese Utility Model Application Publication No. 22590/1966 entitled "Semiconductor Device", the surface of the element is undercoated with a water-repellent silicone resin before the sealing with the epoxy resin, whereby the shielding effect is more enhanced.

In the sealing with only the expoxy resin and even in the resin sealing accompanied by the undercoat treatment, however, the problem remains that when the semiconductor element operates especially in a high temperature state, e.g. 100°C. to 150°C. the deterioration of various characteristics of the element, such as a secular increase of the reverse current of the P-N junction, arises.

The inventors have surveyed the problem of the characteristic deterioration of the element from all angles, and has found the facts to be described hereunder. The water-repellent silicone resin, such as silicone varnish and silicone rubber, employed in the undercoat treatment contains the methyl radical ($CH_3-$) and the phenyl radical ($C_6H_5-$) as side chain radicals. In particular, the phenyl radial is a polar radical of high electronegativity. Due to the phenyl radical, a channel is formed in the surface of the semiconductor element in the state of a high temperature of about 100°C. The deterioration of the element characteristics, such as increase of the P-N junction reverse current, is caused by the presence of this channel.

SUMMARY OF THE INVENTION

On the basis of the survey result, the present invention has solved the problem in the use of resin sealing means.

An object of the present invention is to provide a semiconductor device in which the surface of a semiconductor element is covered with a silicone varnish whose side chain radical ratio between methyl radicals and phenyl radicals is at least 20:1, whereby the secular deterioration of the electrical characteristics of the element can be effectively prevented so as to enhance the reliability of the device.

BRIEF DESCRIPTION OF THE DRAWING

The single FIGURE is a graph of characteristic curves for understanding an embodiment of the semiconductor device according to the present invention.

PREFERRED EMBODIMENT OF THE INVENTION

In the conventional silicone varnish, the ratio between methyl radicals and phenyl radicals in the bonding side chain radicals is approximately from 0.6 to 2.5 due to the easiness in the process for producing such varnish. In contrast, a silicone varnish in the present invention has a ratio between the methyl radicals and the phenyl radicals in the side chain of at least 20:1 generally, the ratio of methyl radicals to phenyl radicals is from 20:1 to 100:1.

The silicone varnish to be used in the present invention is obtained in such a way that silanol ($R-Si(OH)_3$, $R_2-Si(OH)_2$ or $R_3-Si(OH)$ where R denotes a methyl radical or phenyl radical) is purified into a varnish having a methyl radical — phenyl radical ratio of at least 20:1, and such that the purified silanol is polymerized by the use of a catalyst.

Firstly, in order to prepare silanol [$R_nSi(OH)_{4-n}$, $n=1, 2, 3, 4$], previously chlorosilanes [$(CH_3)_nSi(Cl)_{4-n}$] are produced according to the following reaction using metallic silicon and organic halogenide [e.g. methyl chloride ($CH_3Cl$)] as reactors:

$3CH_3Cl + Si \rightarrow (CH_3)_2SiCl$   (main reaction)
$3CH_3Cl + Si \rightarrow (CH_3)SiCl_3 + 2CH_3$
$CH_3Cl + Si + 2CH_3 \rightarrow (CH_3)_3SiCl$   (secondary reaction)

As a result, methyl chlorosilanes such as $(CH_3)_2SiCl$, $(CH_3)SiCl_3$ and $(CH_3)_3SiCl$ are obtained.

On the other hand, by using phenyl chloride $(C_6H_5)Cl$ in place of methyl chloride $(CH_3)Cl$, phenyl chlorosilanes such as $(C_6H_5)_2SiCl_2$, $(C_6H_5)SiCl_3$ and $(C_6H_5)_3SiCl$ are obtained.

Subsequently, by distilling the solutions containing methyl chlorosilanes and phenyl chlorosilanes, methyl chlorosilanes and phenyl chlorosilanes are segregated from the solutions, respectively. Next, by hydrolyzing methyl chlorosilanes and phenyl chlorosilanes, silanols corresponding to the respective chlorosilanes are obtained. That is, chlorosilanes react easily with water and are changed to silanols by substituting (OH) for (Cl), producing HCl as indicated in the following reaction.

$R_nSiCl_{4-n} + (4-n) H_2O \rightarrow R_nSi(OH)_{4-n} + (4-n)HCl$

As one example, in case of $(CH_3)SiCl_3$, reaction is indicated as follows:

$(CH_3)SiCl_3 + 3H_2O \rightarrow (CH_3)Si(OH)_3 + 3HCl$

Similarly, other chlorosilanes may be changed to silanols as indicated in the following, respectively.

$(CH_3)_2SiCl_2 \rightarrow (CH_3)_2Si(OH)_2$ $(CH_3)_3SiCl \rightarrow (CH_3)_3Si(OH)$ $(C_6H_5)SiCl_3 \rightarrow (C_6H_5)Si(OH)_3$

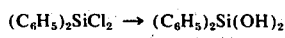
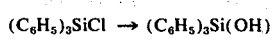

In hydrolyzing, according to the present invention, methyl chlorosilane [e.g. $(CH_3)Si(Cl)_3$] and phenyl chlorosilane [e.g. $(C_6H_5)Si(Cl)_3$] are prepared with a mol ratio of for example 20:1, so that a mixture of $(CH_3)Si(OH)_3$ and $(C_6H_5)Si(OH)_3$ in a ratio of 20 parts of the methyl radicals and one part of the phenyl radicals in the side chain can be obtained. Subsequently, the mixture is heated so as to be dehydrated at 150°–200°C for 2–5 hours under zinc (or, cobalt, lead, tin, etc.) as catalysts, whereby the mixture is polymerized, that is, silicon varnish is obtained.

The resulting product has a three-dimensional net structure as represented in the following formula:

amount, that is the ratio between methyl radicals and phenyl radicals is 20:1 or greater, so that the element can be effectively shielded from the external moisture etc. In particular, even when the element operates in a high temperature state, e.g. 100°C. to 150°C., the deterioration of the element characteristics as in the prior art can be prevented. Moreover, the semiconductor device of the present invention requires only the change of the resin sealing material as compared with the prior-art semiconductor device of the same type, so that it can be performed easily and inexpensively.

It will be understood that one difference between the silicon varnish of the invention and silicon rubber is as follows:

In preparing polymers from a mixture of silanols such as $R_nSi(OH)_{4-n}$, in case of using silanols with $(OH)_{4-n}$ wherein $4-n \geq 3$, the polymer obtained may be called

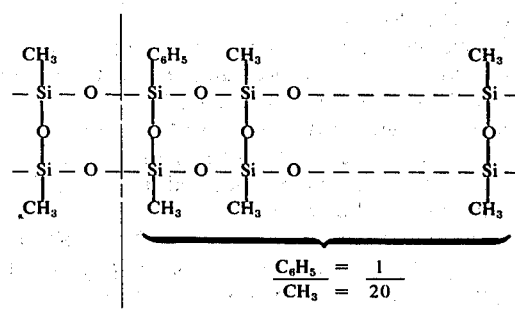
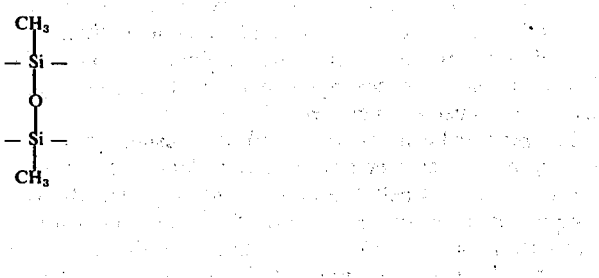

When a mesa type N-P-N transistor, for example, is subjected to the sealing treatment by employing the above silicone varnish, the surface of the element is coated with the varnish of a thickness of 20 – 30 $\mu$, and the varnish is heated to 100° to 200°C for 30 minutes to 10 hours, and hardened. Thereafter, the resultant element is covered and sealed with an epoxy resin of a thickness of 1.5 – 2mm. such as P 410B.

On the mesa type N-P-N transistor thus resin-sealed, the deterioration test of the reverse-biased collector-base dark current $I_{CBO}$ was carried out at an atmosphere temperature of 150°C. and at a collector-base voltage of 300 V. Then, a result as shown at reference numeral 1 in the drawing was obtained. The test was also made of the prior-art sealing methods applying the layers of the same thickness, when appropriate, and the test data are given at reference numerals 2 through 5 in the graph. The curve 2 corresponds to the can sealing, the curve 3 refers to the prior-art silicone varnish of a thickness of 20–30$\mu$ (Epoxy resin sealing of a thickness of 1.5–2mm.), the curve 4, refers to the silicone rubber of a thickness of 50–100$\mu$ (epoxy resin sealing of a thickness of 1.5–2mm.), and the curve 5 refers to the epoxy resin sealing of a thickness of 1.5–2mm. (without an undercoat treatment). From these test data, it is understood that the sealing employing the specified silicone varnish for use in the present invention is substantially more effective for the prevention of the characteristic deterioration of the element.

Although, in the embodiment, the element is covered with the epoxy resin after the undercoat treatment with the silicone varnish, it can also be sealed with only the silicone varnish.

As stated above, according to the semiconductor device of the present invention, the surface of a semiconductor element is covered with a silicone varnish in which the polar phenyl radicals are present in a small silicon varnish since it has a 3-dimensional network structure with or without an organic R substituent, while the silanol with $(OH)_{4-n}$ wherein $4-n<3$, may be called silicon rubber since it has a 2-dimensional network structure, with more than one organic R substituent.

The present invention is not restricted to the preparation of the N-P-N transistors but is applicable to integrated circuits and to further semiconductor devices of all sorts.

It will be further understood that a solvent such as toluene or xylene may be used to prepare a solution of said silicon varnish. However, the solvent is not always necessary since a varnish in liquid form may be used to cure at a high temperature, making the varnish melt. In applying the silicon varnish in solution, the silicon resin or varnish is first kept at room temperature to about 60°C for a few hours to vaporize the solvent. Subsequently, curing is effected at 150° to 200°C for 4 to 25 hours. The concentration of the silicon resin in the solvent are, for example, 50 weight percent. The concentration thereof is determined in accordance with the objects desired.

Also, it will be appreciated that in some cases silanols such as dimethyl silanols are suitable for preparing varnish so long as the mixtures of silanols used contains the proper proportions of methyl and phenyl groups.

While the novel embodiment of the invention has been described, it will be understood that various omissions, modifications and changes in this embodiment may be made by one skilled in the art without departing from the spirit and scope of the invention.

What is claimed is:

1. A semiconductor device comprising a semiconductor element having at least one P—N junction therein and a covering of a silicone varnish on a surface of said semiconductor element, said silicone varnish containing methyl radicals and phenyl radicals as side chain radicals and having in the side chain radicals a ratio between said methyl radicals and said phenyl radicals of at least 20:1.

2. The semiconductor device of claim 1, wherein the ratio between the side chain methyl radicals and the side chain phenyl radicals is from 20:1 to 100:1.

3. The semiconductor device of claim 1, wherein the silicone varnish is applied to a thickness of 20 to 30μ.

4. The semiconductor device of claim 1, wherein the silicone varnish is covered with an epoxy resin.

5. A method for producing a semiconductor device comprising applying a silicone varnish onto a surface of a semiconductor element having at least one P—N junction therein, said silicone varnish containing methyl radicals and phenyl radicals as side chain radicals and having in the side chain radicals, a ratio between said methyl radicals and said phenyl radicals of at least 20:1, and curing the applied silicone varnish at an elevated temperature.

6. The method of claim 5, wherein the silicone varnish comprises a silicone resin having a three-dimensional structure.

7. The method of claim 5, wherein said silicone varnish is heated to a temperature of from 150° to 200°C to effect curing thereof.

8. The method of claim 5, further comprising applying an additional coating of epoxy resin to the cured layer of silicone varnish and thereafter curing the epoxy resin at an elevated temperature.

* * * * *